United States Patent
Mandlik et al.

(10) Patent No.: US 10,862,073 B2
(45) Date of Patent: Dec. 8, 2020

(54) BARRIER FILM FOR ELECTRONIC DEVICES AND SUBSTRATES

(71) Applicants: Universal Display Corporation, Ewing, NJ (US); The Trustees of Princeton University, Princeton, NJ (US)

(72) Inventors: Prashant Mandlik, Lawrenceville, NJ (US); Ruiqing Ma, Morristown, NJ (US); Sigurd Wagner, Princeton, NJ (US); Bhadrinarayana Lalgudi Visweswaran, Princeton, NJ (US)

(73) Assignees: The Trustees of Princeton University, Princeton, NJ (US); Universal Display Corporation, Ewing, NJ (US)

( * ) Notice: Subject to any disclaimer, the term of this patent is extended or adjusted under 35 U.S.C. 154(b) by 1038 days.

(21) Appl. No.: 14/018,449

(22) Filed: Sep. 5, 2013

(65) Prior Publication Data

US 2014/0087497 A1    Mar. 27, 2014

Related U.S. Application Data

(60) Provisional application No. 61/705,463, filed on Sep. 25, 2012.

(51) Int. Cl.
| | |
|---|---|
| *H01L 51/56* | (2006.01) |
| *H01L 51/52* | (2006.01) |
| *H01L 51/00* | (2006.01) |

(52) U.S. Cl.
CPC .......... *H01L 51/56* (2013.01); *H01L 51/5253* (2013.01); *H01L 51/0097* (2013.01)

(58) Field of Classification Search
CPC ..... H01L 27/30; H01L 31/143; H01L 31/162; H01L 33/08; H01L 33/18; H01L 33/24;
(Continued)

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| (Continued) | | |

FOREIGN PATENT DOCUMENTS

| | | |
|---|---|---|
| WO | 2008057394 | 5/2008 |
| WO | 2010011390 | 1/2010 |

OTHER PUBLICATIONS

Baldo, et al., "Highly efficient phosphorescent emission from organic electroluminescent devices", Nature, vol. 395, pp. 151-154, 1998.
(Continued)

*Primary Examiner* — Moin M Rahman
(74) *Attorney, Agent, or Firm* — Butzel Long

(57) ABSTRACT

Methods for forming a coating over a surface are disclosed. A method includes directing a first source of barrier film material toward a substrate in a first direction at an angle θ relative to the substrate, wherein θ is greater than about 0° and less than about 85°. Additionally, a method of depositing a barrier film over a substrate includes directing a plurality of N sources of barrier film material toward a substrate, each source being directed at an angle $θ_N$ relative to the substrate, wherein for each $θ_N$, θ is greater than about 0° and less than about 180°. For at least a first of the $θ_N$, $θ_N$ is greater than about 0° and less than about 85°, and for at least a second of the $θ_N$, $θ_N$ is greater than about 95° and less than about 180°.

20 Claims, 7 Drawing Sheets

(58) Field of Classification Search
CPC . H01L 51/5032; H01L 25/048; H01L 27/288;
H01L 51/5253; H01L 51/0097; H01L
51/50–56; H01L 51/0032–0095; H01L
27/32–3297; H01L 2251/50–568; H01L
27/3244–3279; H01L 27/326–3265
USPC ............ 438/22–47, 69, 493, 503, 507, 956;
257/13, 79–103, 918, 40, 642–643, 759
See application file for complete search history.

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 5,953,587 | A * | 9/1999 | Forrest ............... H01L 27/3209 257/40 |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,548,912 | B1 | 4/2003 | Graff et al. |
| 7,279,704 | B2 | 10/2007 | Walters et al. |
| 7,431,968 | B1 | 10/2008 | Shtein et al. |
| 7,968,146 | B2 | 6/2011 | Wagner et al. |
| 2003/0071569 | A1 * | 4/2003 | Chung ................ H01L 51/5246 313/512 |
| 2003/0230980 | A1 | 12/2003 | Forrest et al. |
| 2004/0113543 | A1 * | 6/2004 | Daniels ............ H01L 27/14627 313/504 |
| 2004/0135160 | A1 * | 7/2004 | Cok ....................... C23C 14/042 257/88 |
| 2004/0174116 | A1 | 9/2004 | Lu et al. |
| 2006/0275926 | A1 * | 12/2006 | Carcia et al. ..................... 438/1 |
| 2007/0126967 | A1 * | 6/2007 | Choi et al. ..................... 349/141 |
| 2008/0032063 | A1 * | 2/2008 | Chang ................... C23C 16/345 427/578 |
| 2008/0102206 | A1 * | 5/2008 | Wagner ....................... 427/255.7 |
| 2008/0102223 | A1 | 5/2008 | Wagner et al. |
| 2008/0237181 | A1 * | 10/2008 | Wagner ............... C23C 16/0245 216/13 |
| 2009/0232976 | A1 * | 9/2009 | Yoon ...................... C23C 14/12 427/157 |
| 2010/0096254 | A1 * | 4/2010 | Hegde .................... C23C 14/35 204/192.12 |
| 2010/0151149 | A1 * | 6/2010 | Ovshinsky ............. C23C 16/24 427/563 |
| 2010/0252539 | A1 * | 10/2010 | Braillard .................. H05H 1/42 219/121.47 |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

* cited by examiner

FIG. 3
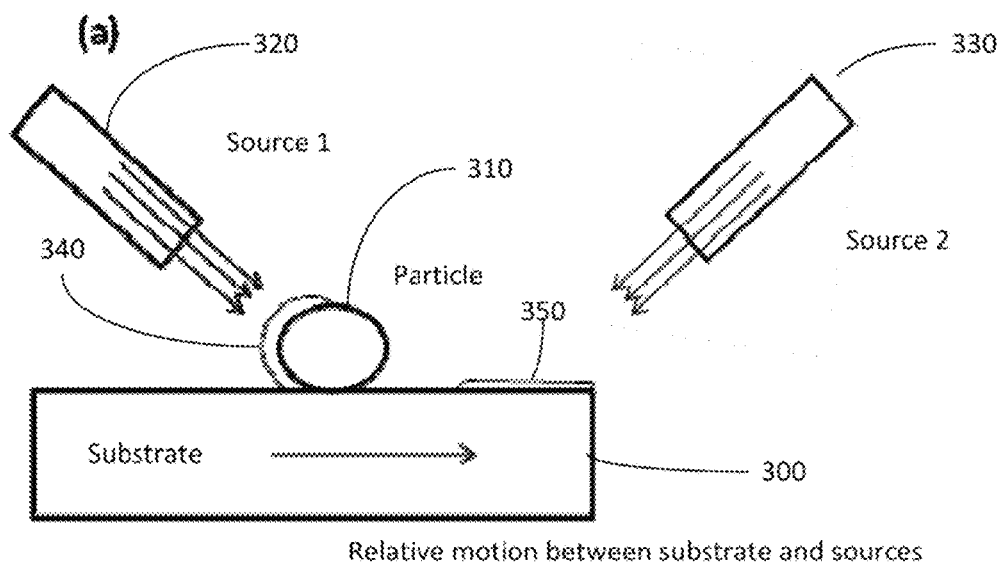
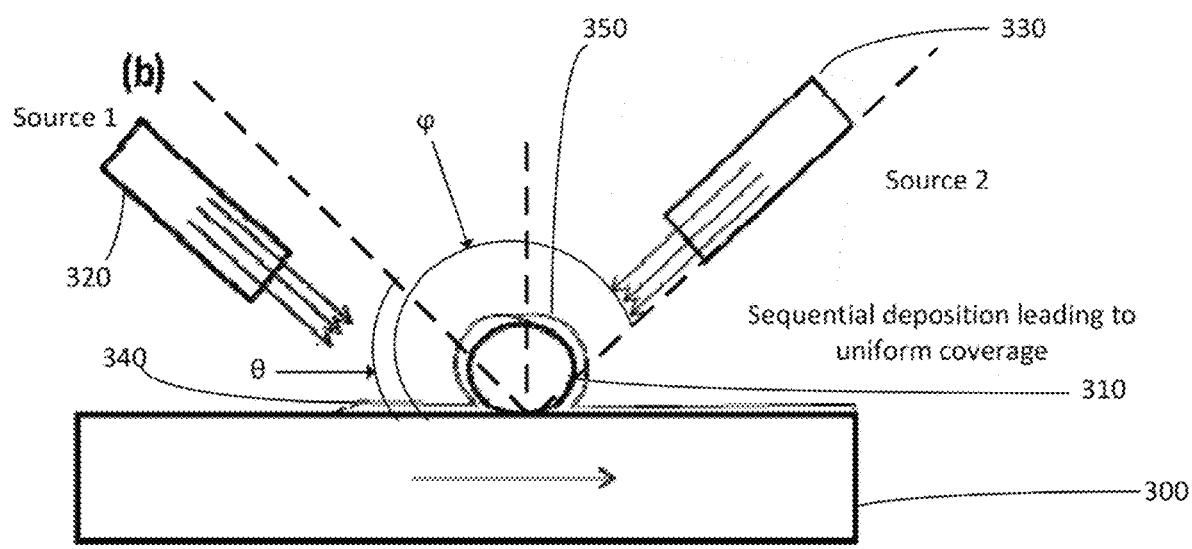

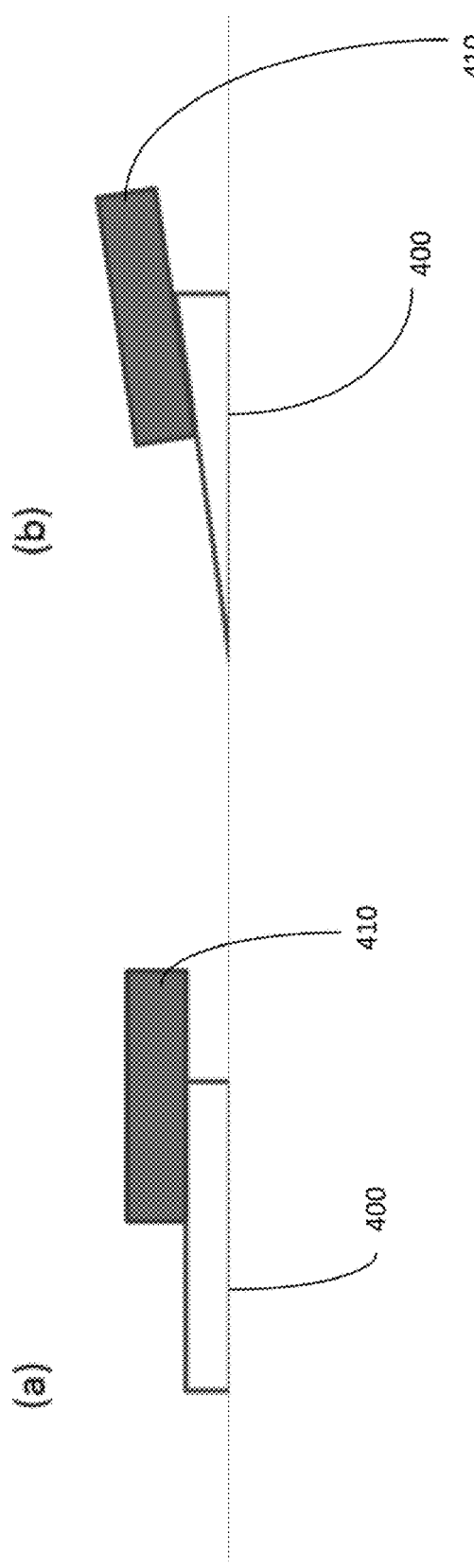
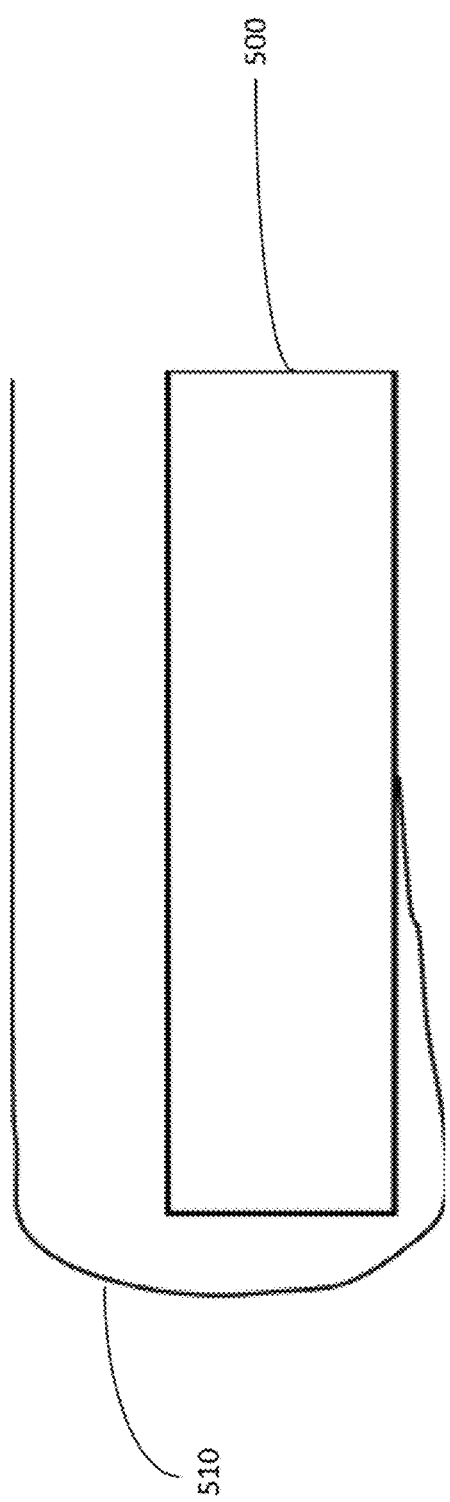

FIG. 6
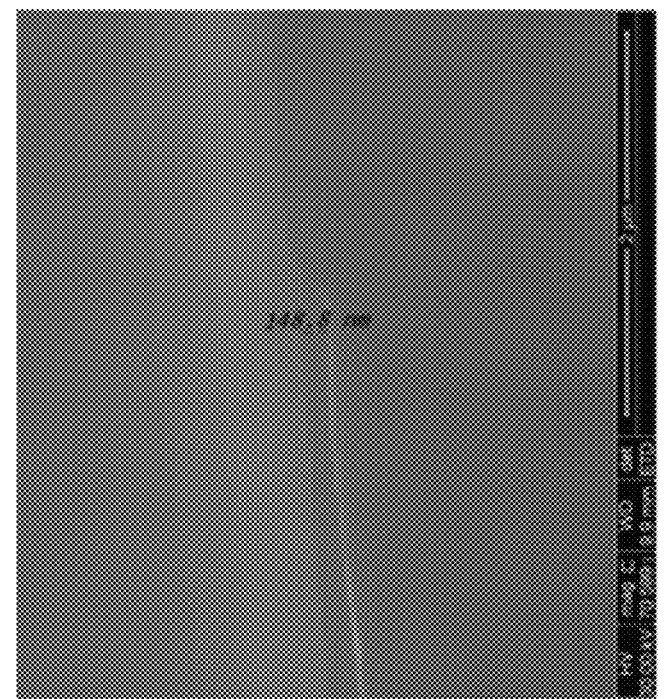
(b)
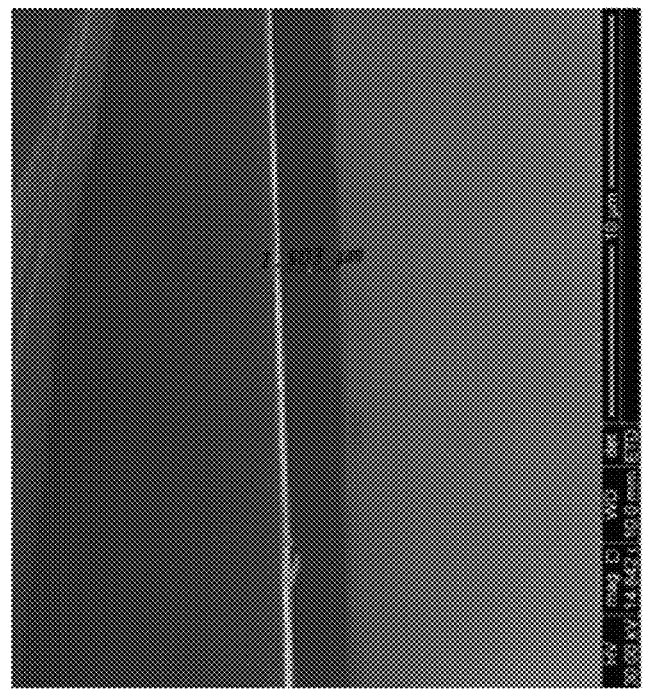
(a)

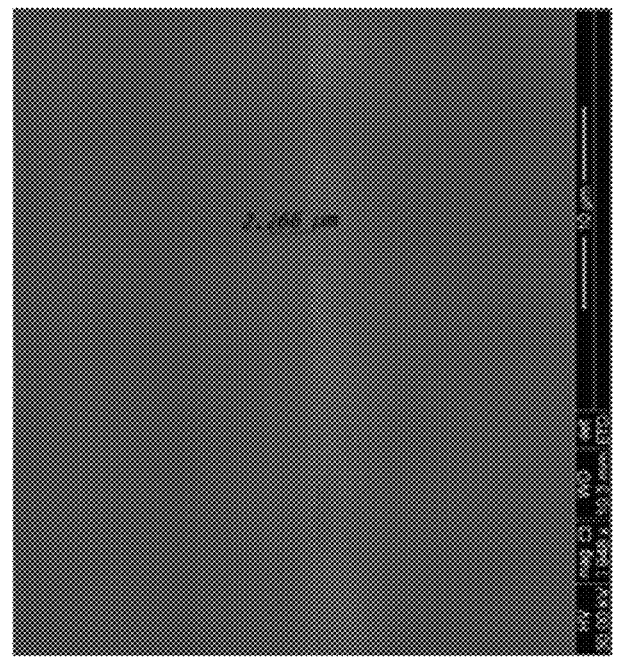
FIG. 7

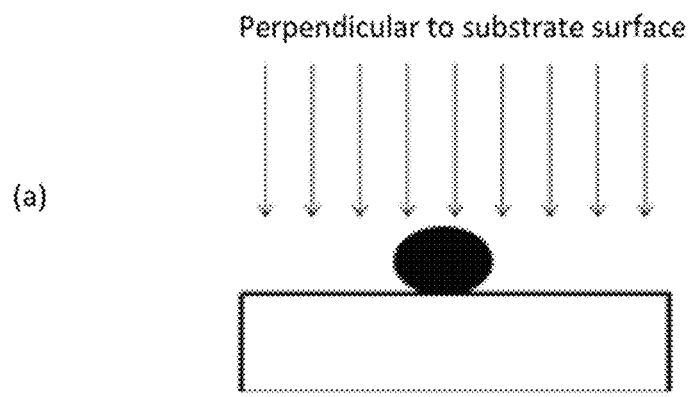
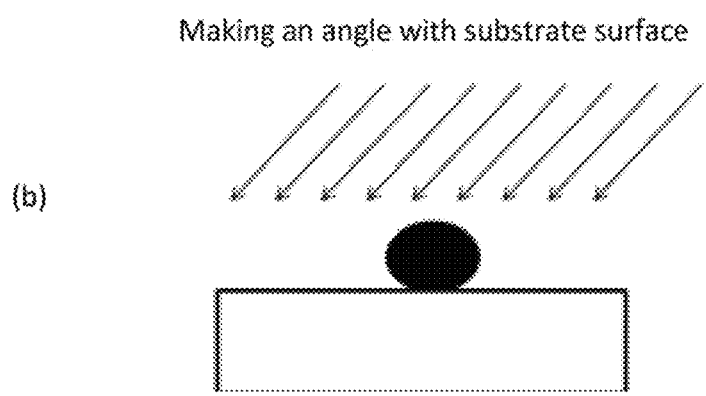
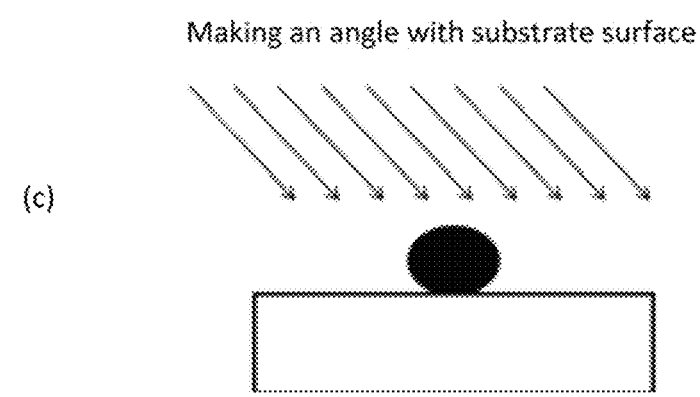
FIG. 8

BARRIER FILM FOR ELECTRONIC DEVICES AND SUBSTRATES

PRIORITY

This application claims priority to U.S. Provisional Application No. 61/705,463, filed Sep. 25, 2012, the disclosure of which is incorporated by reference in its entirety.

FIELD OF THE INVENTION

The present invention relates to barrier coatings for substrates and electronic devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted Ir(ppy)$_3$, which has the following structure:

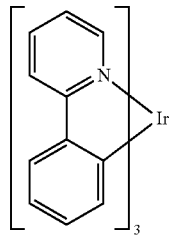

In this, and later figures herein, we depict the dative bond from nitrogen to metal (here, Ir) as a straight line.

More details on OLEDs, and the definitions described above, can be found in U.S. Pat. No. 7,279,704, which is incorporated herein by reference in its entirety.

SUMMARY OF THE INVENTION

In one aspect, a method of depositing a barrier film over a substrate is provided. The method includes directing a first source of barrier film material toward a substrate in a first direction at an angle θ relative to the substrate, wherein 0°<θ<85°. In an aspect, 30°<θ<60°.

In an aspect, directing the first source may be performed using a plasma deposition process, an atomic layer deposition process, and the like. In an aspect, directing the barrier film material toward the substrate causes a single-layer barrier film to be deposited over the substrate.

In an aspect, the barrier film material may comprise a material type such as an oxide, a nitride, a ceramic, and an organic-inorganic hybrid. In an aspect, the barrier film material has a water vapor transmission rate of not more than $10^{-2}$ g/day/m$^2$.

In an aspect, the method of depositing a barrier film over a substrate further includes directing a second source of barrier film material toward a substrate in a second direction at an angle φ relative to the substrate, wherein 95°<φ<180°. In an aspect, 120°<φ<150°. In another aspect, 85°<φ<95°.

In an aspect, the second source of barrier film material is the same as the first source of barrier film material.

In an aspect, subsequent to directing the first source of barrier film material toward the substrate, rotating the substrate through an angle equal to φ−θ.

In an aspect, subsequent to directing the first source of barrier film material toward the substrate, rotating the first source of barrier film material through an angle equal to φ−θ.

In an aspect, subsequent to directing the first source of barrier film material toward the substrate, rotating the substrate in the plane of the substrate.

In an aspect, providing an electric field having a field direction, and providing the substrate at the angle θ relative to the field direction.

In another aspect, the substrate comprises a substantially planar first portion and a substantially non-planar second portion. In an aspect, the substantially non-planar second portion comprises a particle disposed over the first portion.

In an aspect, the substrate comprises an OLED and the OLED may be flexible. In an aspect, the substrate is flexible. In an aspect, the method of depositing a barrier film over a substrate further includes a step of depositing an OLED over the substrate.

In an aspect, a method of depositing a barrier film over a substrate includes directing a plurality of N sources of barrier film material toward a substrate, each source being directed at an angle $θ_N$ relative to the substrate, wherein for each $θ_N$, 0°<θ<180°, and for at least a first of the $θ_N$, 0°<$θ_N$<85°. In an aspect, for at least a second of the $θ_N$, 95°<$θ_N$<180°.

In an aspect, a deposition system includes a first source of barrier film material configured to direct a barrier film material in a first direction, and a substrate support, wherein the first source of barrier film material and the substrate support are positionable to form a relative angle θ between the first direction and a substrate supported by the substrate support, and wherein 0°<θ<85°. In an aspect, 30°<θ<60°.

In an aspect, the first source comprises an electric field generator configured to generate an electric field having a field direction in the first direction.

In an aspect, the first source is fixed, and the substrate support is positionable relative to the first source.

In an aspect, configuring the first source of barrier film material to direct a barrier film material in the first direction is performed using a plasma deposition process. In an aspect, the first source of barrier film material is configured to direct a barrier film material in the first direction is performed using an atomic layer deposition process.

In an aspect, the barrier film material comprises a material type selected from the group consisting of: an oxide, a nitride, a ceramic, and an organic-inorganic hybrid. In an aspect, the barrier film material has a water vapor transmission rate of not more than 10-2 g/day/m2. In another aspect, directing the barrier film material toward the substrate causes a single-layer barrier film to be deposited over the substrate.

In another aspect, a deposition system further includes a second source of barrier film material configured to direct a barrier film material in a second direction, wherein the second source of barrier film material and the substrate support are positionable to form a relative angle $\varphi$ between the second direction and the substrate supported by the substrate support, and wherein $95°<\varphi<180°$. In an aspect, $120°<\varphi<150°$.

In an aspect, the second source of barrier film material is the same as the first source of barrier film material.

In an aspect, a second source of barrier film material may be configured to direct a barrier film material in a second direction, wherein the second source of barrier film material and the substrate support are positionable to form a relative angle $\varphi$ between the second direction and the substrate supported by the substrate support, and, wherein $85°<\varphi<95°$.

In another aspect, a deposition system further includes subsequent to directing the first source of barrier film material toward the substrate, rotating the substrate through an angle equal to $\varphi-\theta$. In an aspect, subsequent to directing the first source of barrier film material toward the substrate, rotating the first source of barrier film material through an angle equal to $\varphi-\theta$.

In an aspect, subsequent to directing the first source of barrier film material toward the substrate, rotating the substrate in the plane of the substrate. In an aspect, the substrate comprises a substantially planar first portion and a substantially non-planar second portion. In an aspect, the substantially non-planar second portion comprises a particle disposed over the first portion.

In an aspect, the substrate comprises an OLED. In an aspect, the OLED may be flexible and/or the substrate may be flexible. In an aspect, the system may further include a step of depositing an OLED over the substrate.

In an aspect, a system for depositing a barrier film over a substrate includes a plurality of N sources of barrier film material, each source configured to direct a barrier film material in a direction, and a substrate support, wherein each source of barrier film material and the substrate support are positionable to form a relative angle $\theta_N$ between the direction and a substrate supported by the substrate support, and wherein for each $\theta_N$, $0°<\theta<180°$, and for at least a first of the $\theta_N$, $0°<\theta_N<85°$. In an aspect, for at least a second of the $\theta_N$, $95°<\theta_N<180°$.

BRIEF DESCRIPTION OF THE DRAWINGS

FIGS. 3(a) and (b) show a schematic depiction of a substrate having a particle and in relative motion with respect to two angular sources.

FIGS. 4(a) and (b) show a Si wafer loaded on a substrate support.

FIG. 5 shows a schematic cross-section of a film coating of a substrate with deposition on the top, side, and bottom surfaces.

FIGS. 6(a) and (b) show SEM cross-sectional micrographs of barrier film on a Si wafer.

FIGS. 7(a) and (b) show SEM cross-sectional micrographs of barrier film on a Si wafer.

FIGS. 8(a), (b), and (c) show a schematic depiction of a substrate having a particle and incoming ions from varying directions.

DETAILED DESCRIPTION

Figure 1:
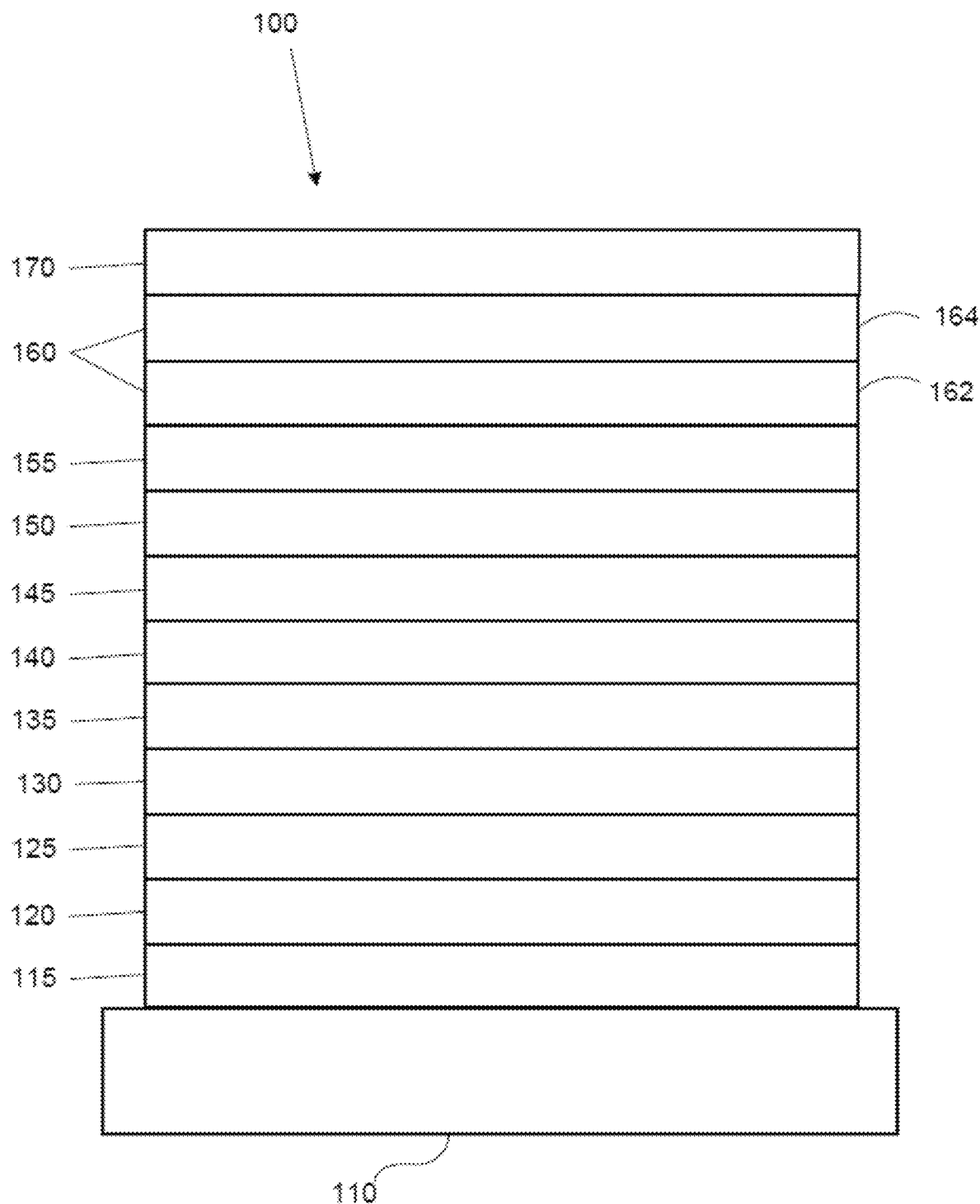
FIG. 1 shows an organic light emitting device.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
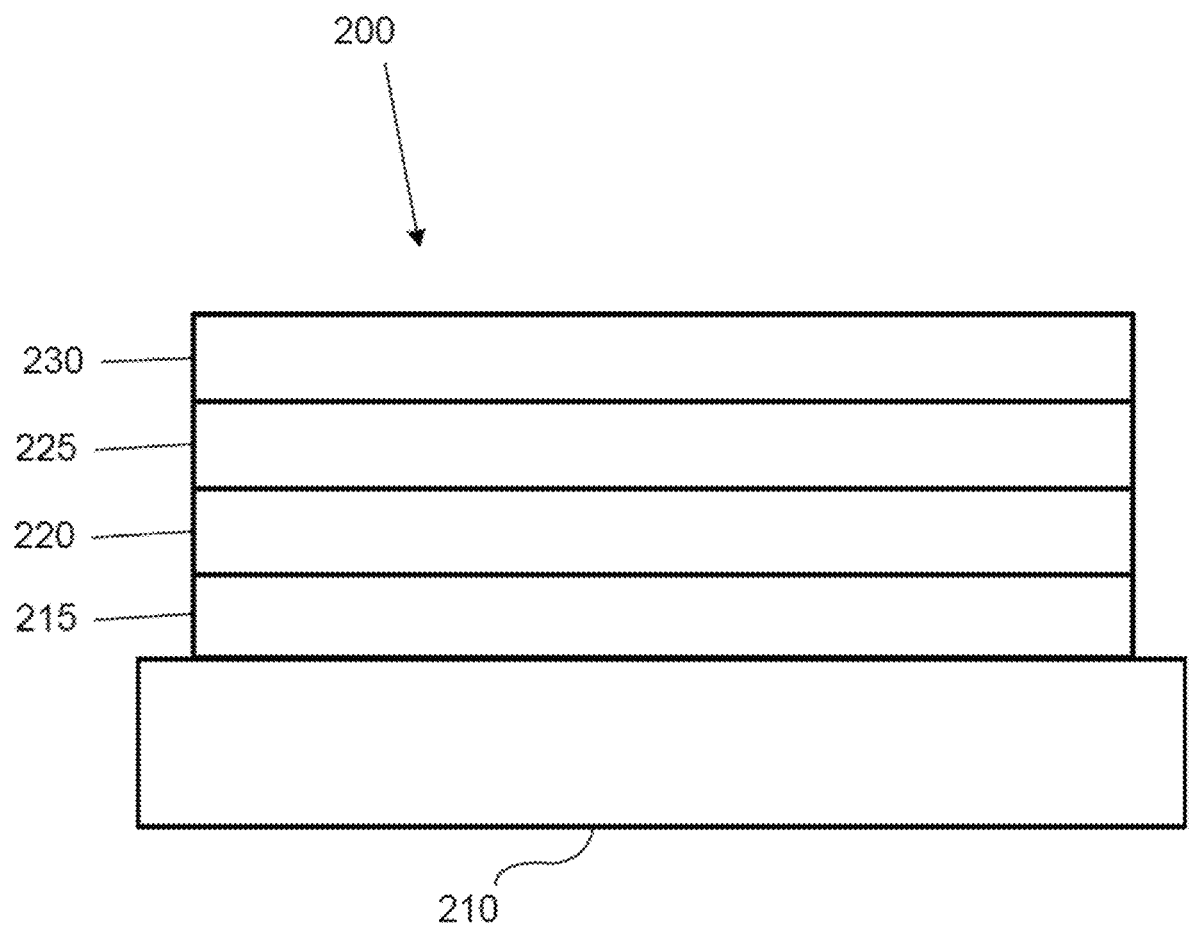
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247, 190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degrees C. to +80 degrees C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

In general, OLEDs and other water sensitive devices can degrade upon storage. Encapsulating OLEDs and other water sensitive devices can help to prolong their shelf life. Glass encapsulation is useful for brittle devices made on glass but is not ideal for flexible or shatter-proof devices. Thin barrier films can be used for such flexible and/or shatter-proof devices. Many new thin film encapsulation barriers have been reported over the past decade with water vapor transmission rates (WVTR) suitable for electronic devices such as OLEDs and solar cells. However, particulate contamination is a major challenge in thin film encapsulation of electronic devices and substrates. Particles thicker than the thin film barrier can remain partially encapsulated and allow for easy passage of water vapor and other atmospheric gases, thereby leading to the formation of defects such as dark spots in OLEDs. Alternatively, growing very thick inorganic layers in order to completely encapsulate a particle that is several microns thick may not be possible because brittle inorganic films may not remain micro-crack free beyond a certain thickness. One option may be to use polymer layers, which can be evaporated at very high deposition rates and/or spun on to fully encapsulate particles. Such a technique is utilized in multilayer barriers where alternate layers of inorganic and polymer films are used. Although multilayer barrier films are suitable for particle coverage, they suffer from other problems such as edge ingress (permeation along the edge), cost effectiveness, and commercial feasibility.

Additionally, moisture and oxygen each have a very low diffusion length through a hybrid layer and hence a hybrid layer having sub-micron thickness may be sufficient to encapsulate a flat surface without particles; however, this is not typical. Under typical conditions, a substrate will accumulate particles, and these particles can detrimentally affect the growth profile of the film. For example, consider a particle sitting on a substrate. When the substrate is mounted perpendicular to the direction of plasma deposition, this configuration broadly results in at least two types of surfaces; exposed surfaces and unexposed surfaces. Exposed surfaces are surfaces in direct contact with plasma and unexposed surfaces refer to surfaces not in direct contact with plasma. In a plasma deposition process, the exposed surfaces are deposited with a film having a thickness greater than a film deposited on the unexposed surfaces. This varying film thickness can lead to improper or partial coverage of particles.

The present disclosure provides methods for depositing a barrier layer and other single layer barrier films. In particular, the embodiments disclosed herein achieve more uniform coverage of substrates and particles, and may be useful in OLEDs, solar cells, or any substrate which may need a permeation barrier. This results in reduced passage of water vapor and other atmospheric gases, thereby preventing defects such as dark spots in OLEDs. In particular, the disclosed methods allow for complete encapsulation of particles without the need for a thick film. According to the disclosed methods, single layer barrier films can be made to encapsulate particles, thereby eliminating the need for polymer films (such as a multilayer barrier) to cover particles.

An example of a barrier layer is a single layer barrier deposited in a single chamber CVD system. This single chamber CVD system utilizes the same precursor, for example a siloxane, throughout the film deposition process. This particular single layer barrier has hybrid qualities because it has two phases, one that is partly oxide-like and another that is partly polymer-like. Both phases are intimately mixed at a molecular level, thus resulting in a hybrid single layer barrier rather than a multilayer film. An example of such a barrier film is described in US20080102223 A1, which is incorporated by reference in its entirety. Other examples of barrier films are described in U.S. Pat. Nos. 7,968,146 and 6,548,912, which are incorporated by reference in their entirety.

For example, it is possible to form a hybrid layer of hybrid polymeric/nonpolymeric character and having characteristics suitable for use in various applications. Such characteristics include optical transparency (e.g., in some cases, the hybrid layer is optically transparent), impermeability, flexibility, thickness, adhesion, and other mechanical properties. For example, one or more of these characteristics may be adjusted by varying the weight % of polymeric material in the hybrid layer, with the remainder being non-polymeric material. For instance, to achieve a desired level of flexibility and impermeability, the wt % polymeric material may preferably be in the range of 5 to 95%, and more preferably in the range of 10 to 25%. However, other ranges are also possible depending upon the application.

As another example, barrier layers made of purely non-polymeric materials, such as silicon oxide, can have various advantages relating to optical transparency, good adhesion, and good film stress. However, these non-polymeric layers tend to contain microscopic defects which allow the diffusion of water vapor and oxygen through the layer. Providing some polymeric character to the non-polymeric layer can reduce the permeability of the layer without significantly altering the advantageous properties of a purely non-polymeric layer. In general, a layer having hybrid polymeric/non-polymeric characteristics reduces the permeability of the layer by reducing the size and/or number of defects, in particular microcracks. Furthermore, a barrier film material may be any other barrier film material not discussed herein.

According to an embodiment of the present disclosure, a method of depositing a barrier film over a substrate is provided. As discussed throughout, embodiments disclosed herein provide for deposition of barrier material on a substrate at various angles of deposition relative to a substrate, and these various angles of deposition are broadly applicable to all embodiments discussed herein. FIGS. 3(a) and 3(b) show a schematic depiction of a substrate in relative motion with respect to two angular sources according to an embodiment of the present disclosure.

As shown in FIG. 3(a), an embodiment includes directing a first source 320 and second source 330 of barrier film material 340 toward a substrate 300 having a particle 310 upon its surface. The substrate is in motion relative to the first and second sources 320, 330. As shown, in this example the substrate is moving to the right while the sources 320, 330 are stationary. More generally, any of the sources and/or substrate may be moved relative to the other. In general, the substrate 300 may include a substantially planar first portion and a substantially non-planar second portion. As an example, the substantially non-planar second portion may include a particle 310 disposed over the first portion. As shown in FIG. 3(b), the first source 320 of barrier film material 340 may be directed in a first direction at an angle $\theta$ relative to the substrate 300. In some embodiments, $\theta$ may be greater than about 0° and less than about 85°, $\theta$ may be greater than about 15° and less than about 85°, $\theta$ may be greater than about 30° and less than about 85°. In some embodiments, $\theta$ may be greater than about 15° and less than about 30°, $\theta$ may be greater than about 15° and less than about 60°, $\theta$ may be greater than about 30° and less than about 45°, $\theta$ may be greater than about 30° and less than about 60°. In some embodiments, $\theta$ may be 45°, $\theta$ may be 30°, or $\theta$ may be 15°. In some embodiments, $\theta$ may be about 45°, $\theta$ may be about 30°, or $\theta$ may be about 15°. Directing the barrier film material 340 toward the substrate 300 may cause a barrier film 340 to be deposited over the substrate 300 and the particle 310. As shown, the first source 320 directs barrier film material generally toward and at an angle to the substrate, to coat a portion of the particle 310 and the substrate 300. In some instances, the first source may include an electric field generator configured to generate an electric field having a field direction in the first direction. Similarly, an electric field may be generated by a source distinct from the sources. The barrier film material ejected by the sources may be charged prior to ejection, such that the electric field causes the material to follow the path indicated, and/or to otherwise deposit on desired areas of the substrate.

In an embodiment, as shown in FIG. 3(a) an embodiment may also include directing a second source 330 of barrier film material 350 toward the substrate 300. As shown in FIG. 3(b), the second source 330 of barrier film material 350 may be directed in a second direction at an angle $\varphi$ relative to the substrate 300. In an embodiment, $\varphi$ may be greater than about 95° and less than about 180°, greater than about 95° and less than about 120°, greater than about 120° and less than about 150°, and greater than about 85° and less than about 95°. In some embodiments, $\varphi$ may be 85°, $\varphi$ may be 90°, $\varphi$ may be 95°, $\varphi$ may be 120°, $\varphi$ may be 135°, $\varphi$ may be 150°, and $\varphi$ may be 165°. As shown, the second source 330 directs barrier film material 350 to coat another portion of the particle 310 and the substrate 300. The use of multiple sources thus may provide more extensive and/or uniform coverage of the non-planar portion of the substrate, while still maintaining uniform coverage of the planar portion. In some instances, the second source of barrier film material may be the same as the first source of barrier film material.

According to an embodiment of the present disclosure, a deposition system may include a first source of barrier film material configured to direct a barrier film material in a first direction and a substrate support. The first source of barrier film material and the substrate support may be positionable to form a relative angle θ between the first direction and a substrate supported by the substrate support as previously described. The relative angle θ may be greater than about 0° and less than about 85°.

In an embodiment, the deposition system described above may include a second source of barrier film material configured to direct a barrier film material in a second direction as previously described with respect to FIG. 3. The second source of barrier film material and the substrate support may be positionable to form a relative angle φ between the second direction and the substrate supported by the substrate support. The relative angle φ may be greater than about 95° and less than about 180°. In an implementation, φ may be greater than about 120° and less than about 150°, and φ may be greater than about 85° and less than about 95°.

According to an implementation the first source may be fixed, and the substrate support may be positionable relative to the first source. In order to achieve more uniform coverage of non-planar portions of a substrate, such as particles disposed on the substrate, subsequent to directing the first source of barrier film material toward the substrate, the substrate may be rotated through an angle equal to φ−θ. As shown in FIGS. 4(a) and 4(b), a substrate 410 may be loaded on a substrate support 400. FIG. 4(b) shows that the substrate 410 may be positionable to create an angle relative to a field of direction associated with a source of barrier film material. Additionally, the substrate may be rotated in the plane of the substrate, for example to allow a single source of barrier film material to direct material toward multiple sides or portions of a non-planar portion of the substrate. For example, considering a single particle disposed on a substrate, the substrate may be rotated in the plane of the substrate to allow a single source of barrier film material to direct material toward every region of the outside of the particle. Further, subsequent to directing the first source of barrier film material toward the substrate, the first source of barrier film material may be rotated through an angle equal to φ−θ.

More generally, a plurality of sources of barrier film or films may be directed toward a substrate at various angles. Such an arrangement may provide for more efficient and/or uniform coating of a non-planar substrate. According to an embodiment, a method of depositing a barrier film over a substrate may include directing a plurality of N sources of barrier film material toward a substrate, each source being directed at an angle $\theta_n$ specific to the source, relative to the substrate. That is, each source may be disposed at an angle that is specific to the source, which may or may not be the same as the angle at which any other of the N sources is arranged. In particular, for each angle $\theta_n$, $\theta_n$ may be greater than 0° and less than 180°. For at least a first of the angles $\theta_1$ at which a first source is arranged, $\theta_1$ may be greater than about 0° and less than about 85°. For at least a second of the angles $\theta_2$ of a second source, $\theta_2$ may be greater than about 95° and less than about 180°.

In an embodiment, a system for depositing a barrier film over a substrate is provided. The system may include a plurality of N sources of barrier film material, each of which is configured to direct a barrier film material in a direction. Each source of barrier film material may be positionable to form a relative angle $\theta_n$, specific to the source, between the direction of the source and a substrate supported by a substrate support as previously described. For each of the angles, the relative angle $\theta_n$ may be greater than about 0° and less than about 180°. In particular, for at least a first of the angles $\theta_1$, $\theta_1$ may be greater than about 0° and less than about 85°. Further, for at least a second of the angles $\theta_2$, $\theta_2$ may be greater than about 95° and less than about 180°. As an example, a deposition system may include 4 sources of barrier film material; each source may be directed towards a substrate. Each source may be configured to form an angle θ, specific to each source, relative to the substrate. The first source may be directed towards the substrate at an angle $\theta_1$ of 30°, the second source may be directed towards the substrate at an angle $\theta_2$ of 110°, the third source may be directed towards the substrate at an angle $\theta_3$ of 80°, the fourth source may be directed towards the substrate at an angle $\theta_4$ of 90°.

As discussed above, directing and/or configuring the first source of barrier film material toward a substrate may be performed using a plasma deposition process, an atomic layer deposition process, and any other process for directing and/or configuring a source of barrier film material toward a substrate.

In general, the barrier film material may be any of the barrier film materials discussed herein. Specifically, the barrier film material may include a material type including one or more of an oxide, a nitride, a ceramic, and an organic-inorganic hybrid. Additionally, in an embodiment, the barrier film material has a water vapor transmission rate of not more than about $10^{-2}$ g/day/m$^2$. In some embodiments, the barrier film material may have a water vapor transmission rate of not more than about $10^{-4}$ g/day/m$^2$, $10^{-5}$ g/day/m$^2$, or $10^{-6}$ g/day/m$^2$.

Furthermore, the substrate described above may be flexible. The substrate may include an OLED, and the OLED may be flexible. In an embodiment, the method described above may also include a step of depositing an OLED over the substrate.

Experimental

For better coverage of a particle, in an aspect, it is desirable to have sufficient barrier film deposition in the plasma shadow regions, which are the underside regions of particles. An increase in the film thickness in the plasma shadow regions was achieved by modifying the orientation of the plasma shadow region with respect to the source of incoming ions and other species associated with the plasma. The following experiments show the impact of changing the orientation of the plasma shadow region to make it more accessible to plasma species from a source.

Two Si wafers were placed in our deposition system. One Si wafer was loaded as shown in FIG. 4(a). Although not shown in FIG. 4(a), the wafer was loaded perpendicular to the direction of electric field associated with plasma from a source. As shown in FIG. 4(b), one Si wafer was loaded at an angle. Although not shown in FIG. 4(b), this wafer was loaded at an acute angle with the electric field associated with plasma from a source. Barrier films were grown on both Si wafers and the thicknesses of each of the resulting films was measured on top and bottom of the wafer. Additionally, the ratio of film thicknesses in the two regions was calculated. Although the barrier film described in US20080102223 A1 was grown on both Si wafers for this experiment, any other barrier film suitable for deposition may be used in the disclosed method. FIG. 5 shows the schematic cross-section of film 510 grown on a Si wafer 500 loaded perpendicular to the direction of electric field associated with plasma from a source. FIG. 5 depicts the change in the thickness of the film 510 from the top side (facing the plasma) to the bottom side (not facing the plasma). As shown in FIG. 5, the portion of the film 510 on the surface facing the plasma source is thicker. Similar cross-sections of films grown on Si wafers are discussed below with regard to FIGS. 6 and 7 in both the perpendicular and angular orientations, respectively.

Furthermore, FIGS. 6(A) and 6(B) shows the SEM cross-sectional micrographs of barrier film on the Si wafer loaded as in FIG. 4(a), i.e., perpendicular to the direction of electric field associated with plasma from a source. FIG. 6(A) shows the thickness of the barrier film of 1.503 μm on the top surface facing the plasma. FIG. 6(B) shows the thickness of the barrier film of 148.8 nm on the bottom surface facing away from the plasma. The ratio of the thicknesses of the film on the top and bottom surfaces is greater than 10.

FIGS. 7(A) and 7(B) show the SEM cross-sectional micrographs of barrier film on Si wafer loaded as in FIG. 4(b), i.e., making an acute angle with the electric field associated with plasma from a source. FIG. 7(A) shows the thickness of the barrier film of 2.266 μm on the top surface facing the plasma. FIG. 7(B) shows the thickness of the barrier film of 532.0 nm on the bottom surface facing away from the plasma. The ratio of the thicknesses of the film on the top and bottom surfaces is approximately 4.25.

The thickness of the barrier film on the top surface of the wafer loaded at an acute angle is 2.266 μm which is greater than the thickness of the barrier film on the top surface of the wafer loaded perpendicular which is 1.503 μm. Additionally, the thickness of the barrier film on the bottom surface of the wafer loaded at an acute angle is 532.0 nm which is greater than the thickness of the barrier film on the bottom surface of the wafer loaded perpendicular which is 148.8 nm. This demonstrates that the film thicknesses on the top and bottom surfaces are greater when the wafer is mounted at an angle relative to the electric field direction.

In the experiment described above, the orientation of the substrate was changed to achieve better coverage of the wafer. Additionally, and as discussed above regarding FIGS. 3(a) and 3(b), the direction of incoming reactants can be changed to achieve the same purpose. FIGS. 8(a), (b), and (c) show a schematic depiction of a substrate having a particle and incoming ions from varying directions. As shown in FIG. 8, incoming ions from a source of barrier film material may be directed towards a substrate surface at varying angles such as perpendicular to the substrate surface as shown in FIG. 8(a) or at an angle to the surface of the substrate as shown in FIGS. 8(b) and (c). Directing a source of barrier film material at an angle such as those shown in FIGS. 8(b) and (c) will coat the shadow regions of the substrate with a particle. This is described in more detail above with regard to FIGS. 3(a) and 3(b). Furthermore, FIGS. 3(a) and 3(b) show a substrate in relative motion with respect to two angular sources. As shown, the first source 320 coats one side of the particle 310 and substrate 300 while the second source 330 coats the other side of the particle 310 and substrate 300. Such sequential deposition leads to uniform coverage of the particle, as further demonstrated by the results of the experiments discussed above. This sequential deposition technique may be part of a roll-to-roll process or other type of fabrication technique.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A method of depositing a barrier film over an organic light emitting diode (OLED), the method comprising:
   directing a first source of barrier film material toward the OLED in a first direction at an angle θ relative to the OLED so that the barrier film material from the first source is disposed on the OLED at a first angle;
   rotating the OLED in a plane of the OLED; and
   directing a second source of barrier film material toward the OLED in a second direction at an angle φ relative to the OLED so that the barrier film material from the second source is disposed on the OLED at a second angle,
   wherein 0°<θ<85°, and
   wherein the OLED is rotated in the plane of the OLED so that at least a portion of the first source of barrier film material and the second source of barrier film material are directed towards exposed regions of the OLED.

2. The method of claim 1, wherein directing the first source is performed using a plasma deposition process.

3. The method of claim 1, wherein directing the first source is performed using an atomic layer deposition process.

4. The method of claim 1, wherein the barrier film material comprises a material type selected from the group consisting of: an oxide, a nitride, a ceramic, and an organic-inorganic hybrid.

5. The method of claim 1, wherein the barrier film material has a water vapor transmission rate of not more than $10^{-2}$ g/day/m$^2$.

6. The method of claim 1, wherein the first source is a linear source.

7. The method of claim 1, wherein 30°<θ<60°.

8. The method of claim 1,
   wherein 95°<φ<180°.

9. The method of claim 1, wherein 120°<<150°.

10. The method of claim 1, wherein the second source of barrier film material is the same as the first source of barrier film material.

11. The method of claim 1,
    wherein 85°<φ<95°.

12. A method of depositing a barrier film over a substrate, the method comprising:
    directing a first source of barrier film material toward the substrate in a first direction at an angle θ relative to the substrate,
    wherein 0°<θ<85°;
    directing a second source of barrier film material toward the substrate in a second direction at an angle φ relative to the substrate,
    wherein 95°<φ<180°, and
    wherein the second source of barrier film material is the same as the first source of barrier film material; and
    subsequent to directing the first source of barrier film material toward the substrate, rotating the substrate through an angle equal to φ−θ.

13. A method of depositing a barrier film over a substrate, the method comprising:
    directing a first source of barrier film material toward the substrate in a first direction at an angle θ relative to the substrate,
    wherein 0°<θ<85°;

directing a second source of barrier film material toward the substrate in a second direction at an angle φ relative to the substrate, wherein $95°<φ<180°$, and wherein the second source of barrier film material is the same as the first source of barrier film material; and subsequent to directing the first source of barrier film material toward the substrate, rotating the first source of barrier film material through an angle equal to $φ−θ$.

14. A method of depositing a barrier film over a substrate, the method comprising:

directing a first source of barrier film material toward the substrate in a first direction at an angle θ relative to the substrate, wherein $0°<θ<85°$;

directing a second source of barrier film material toward the substrate in a second direction at an angle φ relative to the substrate, wherein $95°<φ<180°$, and wherein the second source of barrier film material is the same as the first source of barrier film material; and subsequent to directing the first source of barrier film material toward the substrate, rotating the substrate in a plane of the substrate.

15. The method of claim 1, further comprising:

providing an electric field having a field direction; and providing the OLED at the angle θ relative to the field direction.

16. The method of claim 1, wherein the OLED comprises a substantially planar first portion and a substantially non-planar second portion.

17. The method of claim 16, wherein the substantially non-planar second portion comprises a particle disposed over the first portion.

18. The method of claim 1, wherein the OLED is flexible.

19. A method of depositing a barrier film over an organic light emitting diode (OLED), the method comprising:

directing a plurality of N sources of barrier film material toward the OLED, each source being directed at an angle θn specific to the source, relative to the OLED, so that the barrier film material from a first source of the plurality of N sources is disposed on the OLED at a first angle, rotating the OLED, and directing the barrier film material from a second source of the plurality of N sources to be disposed on the OLED at a second angle, wherein for each angle, $0°<θn<180°$, and for at least the first angle of the angles θ1, $0°<θ1<85°$, and wherein the OLED is rotated in the plane of the OLED so that at least a portion of the first source of barrier film material and the second source of barrier film material are directed towards exposed regions of the OLED.

20. The method of claim 19, wherein, for at least the second angle of the angles θ2, $95°<θ2<180°$.

* * * * *